US007830225B2

(12) United States Patent
Gale

(10) Patent No.: US 7,830,225 B2
(45) Date of Patent: Nov. 9, 2010

(54) ELECTRIC SIGNAL SPLITTERS

(76) Inventor: Robert D. Gale, 4811 Chippendale La., Suite 703, Sacramento, CA (US) 95841

( * ) Notice: Subject to any disclaimer, the term of this patent is extended or adjusted under 35 U.S.C. 154(b) by 454 days.

(21) Appl. No.: 11/452,506

(22) Filed: Jun. 13, 2006

(65) Prior Publication Data

US 2006/0279379 A1 Dec. 14, 2006

Related U.S. Application Data

(60) Provisional application No. 60/690,208, filed on Jun. 13, 2005.

(51) Int. Cl.
*H03H 7/38* (2006.01)
*H01P 3/08* (2006.01)

(52) U.S. Cl. ....................... 333/131; 333/125; 333/128; 333/136

(58) Field of Classification Search ................. 333/100, 333/124, 131, 125, 127, 128, 136
See application file for complete search history.

(56) References Cited

U.S. PATENT DOCUMENTS

| | | | |
|---|---|---|---|
| 3,091,743 A | | 5/1963 | Wilkinson |
| 3,440,329 A | | 4/1969 | Winston |
| 3,486,135 A | | 12/1969 | Sweeney |
| 3,641,464 A | | 2/1972 | Crowhurst at at |
| 3,673,517 A | * | 6/1972 | Ticknor ...................... 333/131 |
| D236,481 S | | 8/1975 | Johnston |
| 3,951,490 A | | 4/1976 | Devendorf |
| 4,015,070 A | | 3/1977 | Theurer |
| 4,141,615 A | | 2/1979 | Takeuchi et al. |
| 4,226,495 A | | 10/1980 | Palle et al. |
| D261,503 S | | 10/1981 | Shu |
| D264,710 S | | 6/1982 | Shu |
| D274,717 S | | 7/1984 | Shu |
| 4,626,633 A | | 12/1986 | Ruehl et al. |
| 4,648,682 A | | 3/1987 | Tubbs |
| 4,740,172 A | | 4/1988 | Tubbs |
| 4,755,776 A | | 7/1988 | Preschutti |

(Continued)

OTHER PUBLICATIONS

Hometech Solutions; RF (VHF/UHF/FM/CATV/Satellite) Splitters; A Splitter Primer; Internet; Mar. 8, 2005; 7 pgs; USA.

*Primary Examiner*—Robert Pascal
*Assistant Examiner*—Kimberly E Glenn
(74) *Attorney, Agent, or Firm*—Glen L. Gross; Shlesinger, Arkwright & Garvey LLP

(57) ABSTRACT

The present invention is an electronic signal continuity device comprising an electrically conductive case having a volume, an input port and at least two output ports. The continuity device further includes a printed circuit board (PCB) in electrical communication with the input port and the output ports. The PCB is operably configured to split an electronic signal received at the input port to the output ports. Additionally, the PCB is disposed within the volume of the electrically conductive case. Further, the PCB includes an orifice and a plurality of electronic components, wherein one of the plurality of electronic components is disposed in the orifice. The case further includes a first portion and a second portion opposing the first major portion, wherein one of the two output ports and the input port are disposed on the first portion, and one of the two output ports is disposed on the second portion.

26 Claims, 4 Drawing Sheets

U.S. PATENT DOCUMENTS

| | | | |
|---|---|---|---|
| D301,239 S | 5/1989 | Chino | |
| 4,875,024 A | 10/1989 | Roberts | |
| D306,716 S | 3/1990 | Shimirak | |
| 5,021,755 A | 6/1991 | Gustafson | |
| 5,058,198 A | 10/1991 | Rocci et al. | |
| 5,059,141 A | 10/1991 | Scott | |
| 5,164,689 A | 11/1992 | Plonka | |
| D346,789 S | 5/1994 | Sanchez et al. | |
| 5,347,245 A | 9/1994 | Wright, Jr. | |
| 5,411,405 A | 5/1995 | McDaniels et al. | |
| 5,416,453 A | 5/1995 | Quan | |
| D366,456 S | 1/1996 | Rodriguez et al. | |
| 5,572,143 A | 11/1996 | Myers et al. | |
| 5,666,408 A | 9/1997 | Lao | |
| 5,675,300 A | 10/1997 | Romerein | |
| 5,677,578 A | 10/1997 | Tang | |
| 5,687,213 A | 11/1997 | Larkin | |
| D389,112 S | 1/1998 | Chung | |
| D389,801 S | 1/1998 | Foye | |
| 5,735,711 A | 4/1998 | Fremgen | |
| D396,695 S | 8/1998 | Shen | |
| 5,790,411 A | 8/1998 | Nelson | |
| 5,796,316 A | 8/1998 | Romerin | |
| D397,695 S | 9/1998 | Wittmeier, II et al. | |
| D399,846 S | 10/1998 | Beggs | |
| D404,713 S | 1/1999 | Hsiang | |
| D408,363 S | 4/1999 | Hsiang | |
| D408,364 S | 4/1999 | Hsiang | |
| 5,903,829 A | 5/1999 | Anderson et al. | |
| D410,629 S | 6/1999 | Bandura et al. | |
| D410,895 S | 6/1999 | Bandura et al. | |
| 5,909,155 A | 6/1999 | Anderson et al. | |
| 5,973,262 A | 10/1999 | Matuara | |
| 5,997,358 A | 12/1999 | Adriaenssens et al. | |
| D421,965 S | 3/2000 | Johnston et al. | |
| 6,118,354 A | 9/2000 | Decramer et al. | |
| 6,289,210 B1 | 9/2001 | Anderson et al. | |
| D459,304 S | 6/2002 | Malin | |
| D459,305 S | 6/2002 | Malin | |
| D459,306 S | 6/2002 | Malin | |
| 6,437,580 B1 | 8/2002 | Gale | |
| 6,482,019 B1 | 11/2002 | La Forte et al. | |
| D475,019 S | 5/2003 | Soulodre | |
| D475,020 S | 5/2003 | Soulodre | |
| 6,570,465 B2 | 5/2003 | Tang | |
| D475,350 S | 6/2003 | Soulodre | |
| 6,599,152 B1 | 7/2003 | Oliphant et al. | |
| 6,653,846 B2 | 11/2003 | James | |
| 6,731,217 B1 | 5/2004 | Warner | |
| D492,292 S | 6/2004 | Ogren | |
| 6,786,757 B2 | 9/2004 | Pocrass | |
| 6,790,049 B2 | 9/2004 | Kaylle et al. | |
| 6,844,793 B2 | 1/2005 | Kenington | |
| 6,956,449 B2 * | 10/2005 | Snyder et al. | 333/116 |
| 6,960,917 B2 | 11/2005 | Parker et al. | |
| 7,030,624 B1 | 4/2006 | Love | |
| 7,126,437 B2 * | 10/2006 | Simon et al. | 333/24 R |
| 7,160,151 B1 | 1/2007 | Rigby et al. | |

* cited by examiner

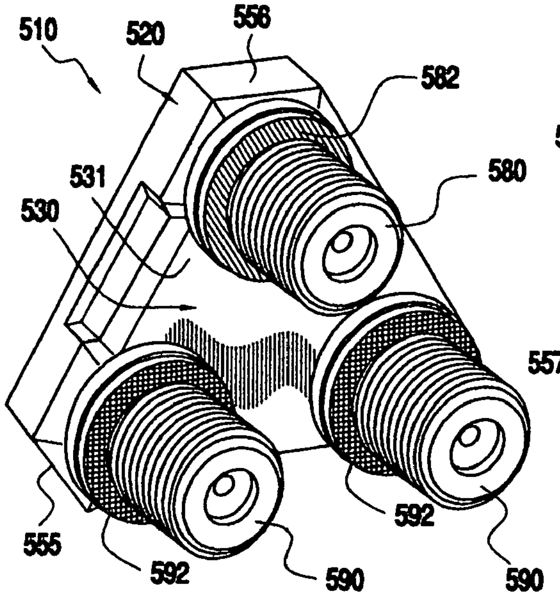
FIG. 5A
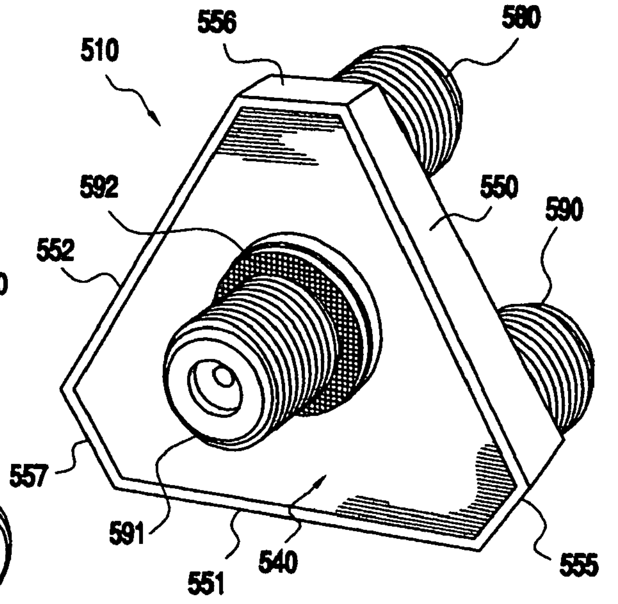
FIG. 5B
FIG. 5C
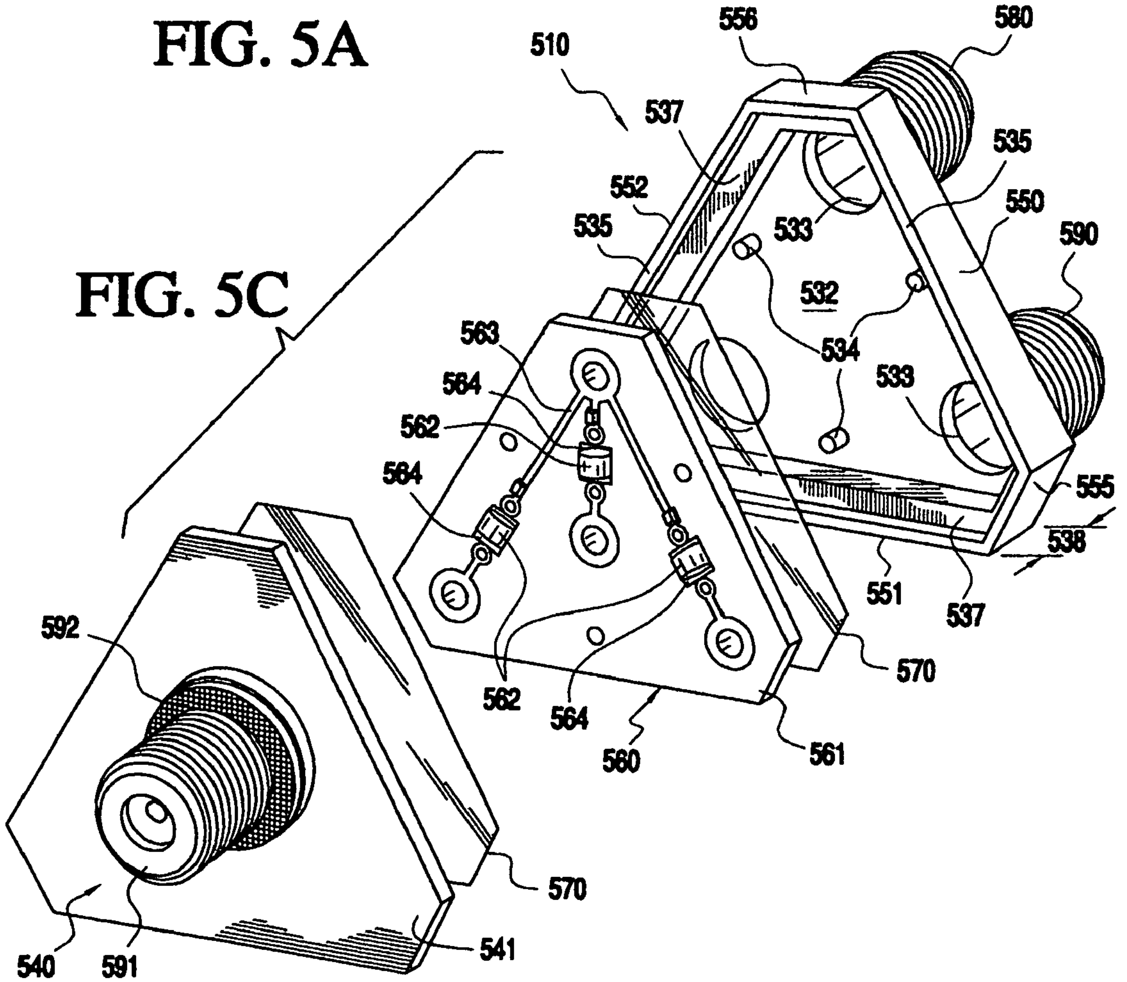

FIG. 6
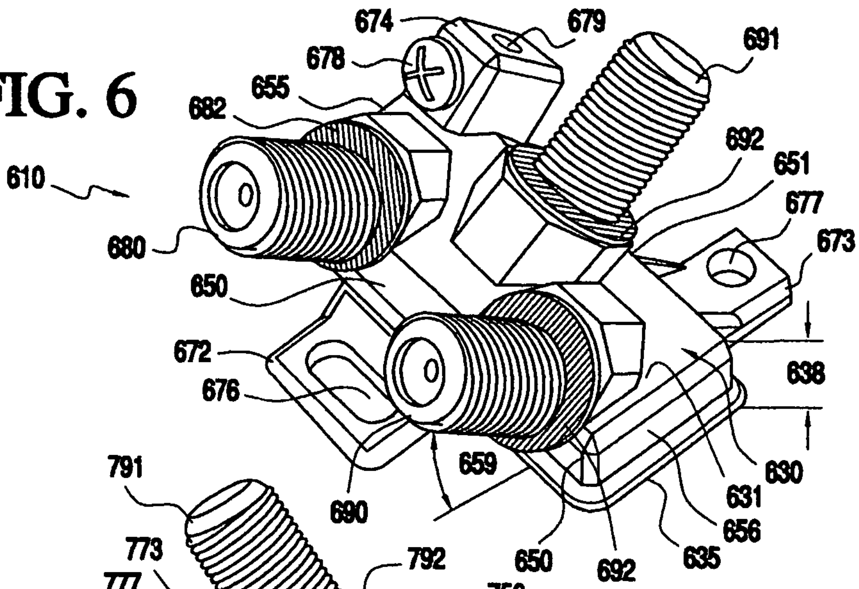
FIG. 7
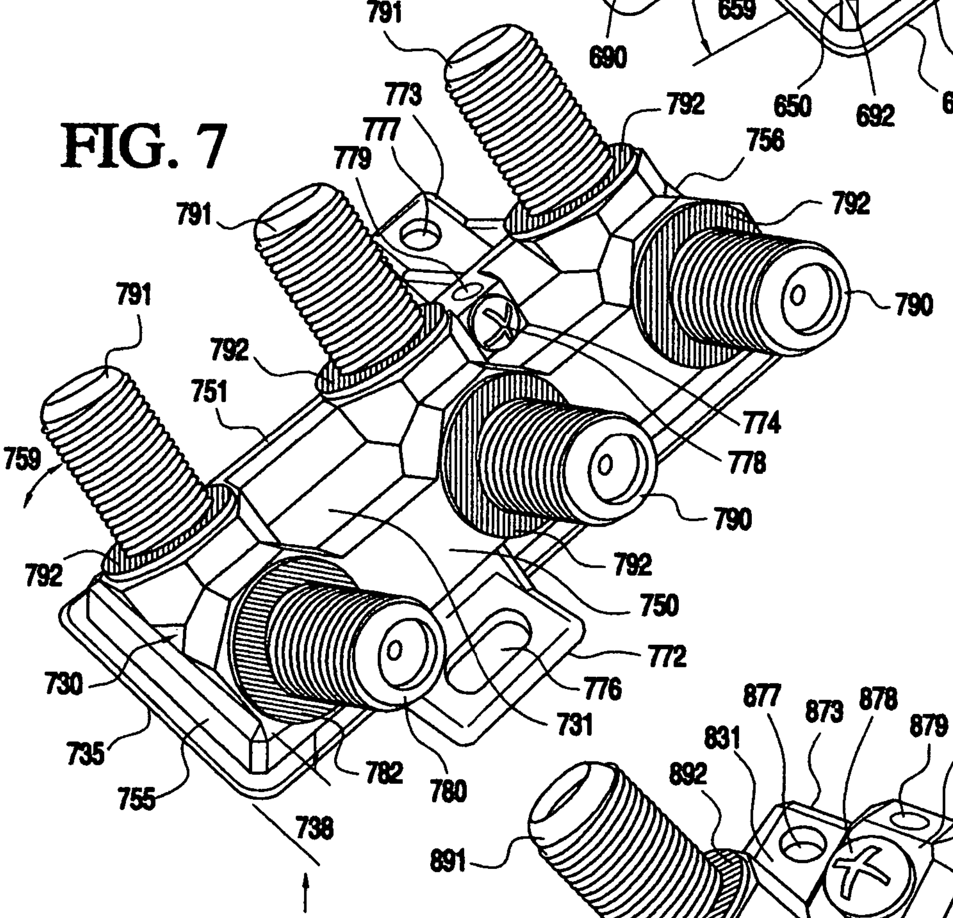
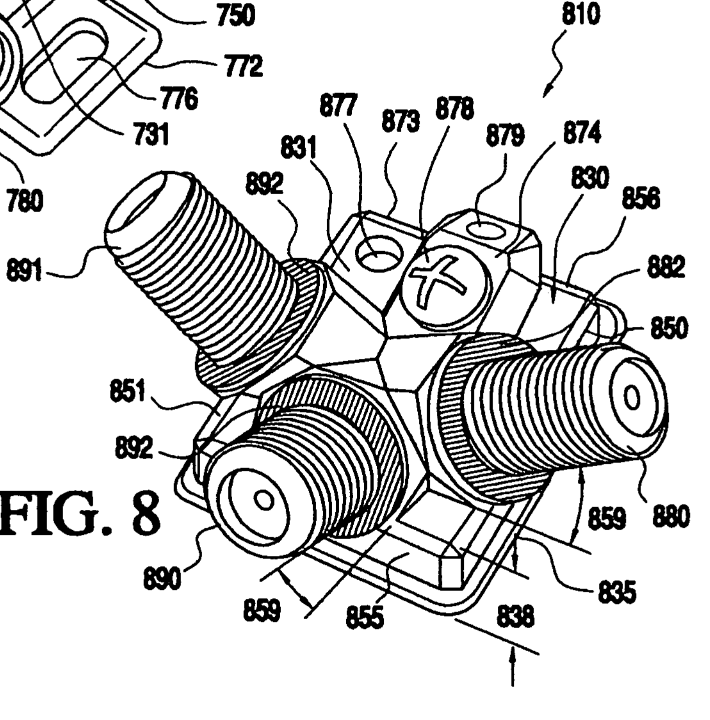
FIG. 8

ELECTRIC SIGNAL SPLITTERS

CROSS REFERENCE TO RELATED APPLICATION

This nonprovisional application claims the benefit of Provisional Application No. 60/690,208, filed on Jun. 13, 2005, which is incorporated herein by reference in its entirety and to which priority is claimed.

BACKGROUND OF THE INVENTION

1. Field of Invention

The present invention is related to the field of electronic signal splitter and combiners, in particular radio frequency splitters.

2. Description of Related Art

Televisions and computers and other similar devices receive electronic signals from a variety of sources. The primary means to deliver electronic signals is through cables, predominately coaxial cables, which carry a signal from sources such as satellite receivers, land-line cable or roof mounted antennas. Many homes, apartments and offices today have multiple televisions and computers that used these signals. It is not the intent of this invention to discuss how an electronic signal is delivered to a building. The focus of the present invention is upon distribution of an electronic signal once it has arrived at the building. Coaxial cables (coax cables) are the primary method used to carry the source signal from the initial receiving point of the building to the device or device using the signal. In a typical installation, one coax cable delivers the input signal to a signal splitter. This splitter may have any number of outputs. Additionally, downstream of the first signal splitter may be other signal splitters to further the distribution of the signal to other rooms. The coax cable is typically terminated into a standard electrical gang box where the cable is attached to a variety of terminal ends as needed for the receiving device. The additional signal splitters used downstream of the source signal to aid in the distribution of the signal throughout the building are typically installed in crawl space, attics or basements due to the size constraints of the signal splitters, making access to them very inconvenient.

A signal splitter takes one incoming signal and divides that signal into two or more output signals of equal amplitude and equal phase. Among splitters there exist many different types. Some common features of all splitters are that every splitter has an input port, at least two output ports, an electrically conductive casing and a printed circuit board. Coaxial cable splitters can theoretically have an infinite number of output ports.

In the art of conventional coaxial cable signal splitters, many type of devices and designs exist. The size of coaxial cable splitters is limited by at least several design features. One design limitation is the size of the cable connection ports. The coaxial cable has a fixed diameter that therefore the ports connecting the coaxial cable to the splitter casing or box must match the size of the cable. Another design feature causing a required box size for conventional signal splitter is the printed circuit board or PCB inside the splitter box. The PCB of a splitter box contains miniature transformers, also called splitter cores, for each output port as well as other common electrical components. These conventional splitter cores require a volume of space on the PCB and inside the casing.

Still additional design limitation for splitter boxes is the manner in which the circuit board is attached to the splitter box Splitter circuit boards are secured by screws to posts within the splitter box.

Because of the above mentioned design limitations, conventional splitter casings are rather bulky and boxy for their relatively small size. This bulkiness restricts the usefulness of conventional splitters in small places, for example common electrical gang boxes or outlet box. If a conventional splitter is installed in an outlet box, no room is left for other devices, such as a phone jack or modem cable jack. The size of conventional splitter casings places a limitation on where the casings can or cannot be installed.

A further problem with conventional coaxial cable splitters that have many output ports and one input ports is the problem of quickly identifying which port is which by looking at the casing. Many conventional splitter devices have labels on the splitter case itself with the words, “In” and “Out,” however in dark and or tight spaces reading these words can be difficult to see and or read Still, another deficiency with current splitter boxes is the placement of the ports. Port location is due in large part to the size requirements of the ports themselves and limitations of the placement of the splitter cores on the circuit boards. Current conventional splitter boxes have many port placement configurations such as, the input and all output ports on one surface of the splitter box, or, the input port on one surface and the output ports on a different surface or a combination of input and output ports on a surface with a multiple of output ports on another surface. However, conventional splitters do not have only one output port on a side opposite the input port. This deficiency of not having an output port on a side opposite the input port limits the adaptability of current signal splitters.

Additionally, conventional splitters have a high insertions loss between the input signal and the output signal. Conventional devices also have what is called a return loss for applications, such as Voice Over Internet Protocol (VOIP) or other applications that utilize a reverse path.

SUMMARY OF THE INVENTION

The present invention relates to the field of electronic continuity devices, wherein an electronic signal is allowed to continue through the device. More particularly, the present invention relates to electronic signal splitters. It should be understood that a device that splits an electronic signal can also combine electronic signal if the direction of the signal is reversed. Therefore, while a splitter will have one input terminal and at least two output terminals, these same terminals will reverse their respective terms when used as a combiner.

The manner in which an electronic signal is splitter is accomplished in a process applying a “Wilkinson” technique. The Wilkinson technique splits an electronic signal by the use of one-quarter wavelength impedance matching transformers and output impedance lines. The present invention utilizes current splitter technology, such as but not limited, to the Wilkinson technique.

The present invention includes one input port and multiple “n” output ports. The present invention has in particular an exemplary embodiment of one output port on a surface opposite the surface which contains the input port and at least one output port. This feature allows a multi-port splitter to be installed in a standard electrical outlet box with a wall plate. Further, by applying the present invention in this application, less coaxial cable is used because the splitting device is now in the room instead of an attic, basement or crawl space.

Additionally, the present invention, by the unique design, has reduced the size of the splitter casing and allows the use of a multi-port splitter in smaller areas, such as a standard electrical outlet box with additional connections in the same outlet box such as a telephone jack or modem jack. This reduced size is accomplished by the incorporation of component recesses or voids constructed into the printed circuit board (PCB) of the splitter. The PCB uses the most current technology in the art of splitters. The PCB contains transformers or splitter cores for each output port on the splitter as well as other electrical components common in the art of electronic signal splitters. Splitter cores generally are soldered to the surface of the PCB of conventional type splitters, and this type of mounting consumes valuable space. The present invention contains component voids and thus optimizes the use of space within a splitter box and overcomes the problem by disposing the splitter cores within the component voids.

Further, the present invention presents through the unique size of the case and construction of the PCB provides an advantage over conventional devices by reducing signal insertion loss. For applications that utilize reverse path the present invention also reduces return loss.

Additionally, more and more homes and apartments are being built with central wiring cabinets wherein all the wires and cables for every low-voltage system come to one place. One of the items in these "central wiring cabinets" is a coaxial splitter. While the concept of the central wiring cabinet is sound, it is costly, especially in multi-dwelling units. The present invention with its reduced sized combined with the output port on a side opposite the input port and multiple output ports, can be used as a mini central wiring point or "hub." This feature becomes valuable in the wiring of multi dwelling units or many rooms in a house. The present invention can be placed into a standard electrical outlet box and then be used to route coaxial cables to many neighboring rooms. This would replace the need for a coaxial cable wiring cabinet and reduce cost.

The present invention further include an exemplary embodiment, wherein the ports are connected to the casing at 45 degree angles to the casing. This feature aids in routing coaxial cables through tight 90 degree corners without causing the coaxial cable to pinch or bind.

Additionally, the present invention includes a color coding scheme. This feature aids in the quick identification of the different number of ports on the splitters, as well as whether a particular port is an input port or an output port.

The present invention comprises an electronic signal continuity device, which comprises an electrically conductive case having a volume, an input port and at least two output ports, wherein the input and output ports each include a path of electrical connectivity. Further the electronic signal splitter device also includes a printed circuit board (PCB) in electrical communication with the input port and the output ports through each path of electrical connectivity and operably configured to transmit an electronic signal received at the input port to the output ports. The PCB is disposed within the volume of the electrically conductive case, and the PCB further includes an orifice and a plurality of electronic components, wherein at least one of the plurality of electronic components is disposed in the orifice.

Further, the present invention provides a signal continuity device comprising an electrically conductive housing having a first major surface and an opposing second major surface and a volume. The continuity device further comprise a printed circuit board (PCB) being disposed in the volume and operably configured to transmit an incoming electronic signal. The continuity device additionally includes an input port disposed on the first major surface and being in electrical communication with the PCB; a first output port disposed on the first major surface and being in electrical communication with the PCB; and, a second output port disposed on the opposing second major surface and being in electrical communication with the PCB.

Still further, the present invention describes frequency continuity case being electrically conductive, which comprises a first major surface; a second major surface opposing the first major surface; a first end surface connecting the first and second major surfaces; a second end surface opposing the first end surface and connecting the first and second major surfaces; and an angle alpha. The angle alpha is from the first major surface in a direction away from the second major surface. Further, the frequency continuity case also includes an electrical input connector disposed on the first major surface at the angle alpha and adjacent to the connection of the first major surface and the first end surface; and, at least two electrical output connectors disposed on the first major surface. Additionally, one of the at least two electrical output connectors is disposed on the first major surface at the angle alpha, adjacent to the connection of the first major surface and the second end surface, and being oriented generally perpendicular to the electrical input connector. Further, the other of the at least two electrical output connectors is disposed on the first major surface at the angle alpha, and the other of the at least two electrical output connectors is disposed adjacent to one of the connection of the first major surface and the second end surface, and the first major surface and the first end surface.

Moreover, the present invention presents in detail an electronic signal continuity printed circuit board (PCB), which comprises a main board with integrated electronic circuitry operably configured to transmit an incoming electronic signal into at least two outgoing electronic signals. The electronic signal continuity PCB further comprises a component void recessed into the main board; and, a plurality of electronic components attached to the main board, wherein at least one of the component voids is formed on the main board and at least one of the plurality of electronic components is disposed in the void.

Even further, the present invention presents an indicator coding method for electronic signal continuity devices, comprising the steps of obtaining a first electronic signal continuity device having one input port and at least two output ports; obtaining a second electronic signal continuity device having one input port and at least one more output port than the first electronic signal continuity device; obtaining a plurality of first coded indicator rings having a first color; obtaining a plurality of second coded indicator rings having a second color; and, obtaining a plurality of third coded indicator rings having a third color. The indicator coding method further includes the steps of affixing the first coded indicator rings to the input ports of both the first and second electronic signal continuity devices; affixing the second coded indicator rings to the output ports on the first electronic signal continuity device; and, affixing the third coded indicator rings to the output ports on the second electronic signal continuity device.

Additionally the present invention is an electronic signal splitter device comprising a electrically conductive case having a volume, an electrically conductive input port and at least two electrically conductive output ports. The electrically conductive case includes a first major portion and a second major portion opposing the first major portion. The electronic signal splitter device further comprises a printed circuit board (PCB)

operably configured to split an electronic signal received at the electrically conductive input port to the at least two electrically conductive output ports. The PCB is disposed in the volume of the electrically conductive case, and the PCB further including an orifice and a plurality of electronic components; wherein at least one of the plurality of electronic components is displaced in the orifice. Additionally, one of the at least two electrically conductive output ports and the input port are disposed on the first major portion, and the remaining at least two electrically conductive output ports are disposed on the second major portion.

This invention overcomes the drawbacks and shortcomings of the prior art conventional devices and systems. These and other features and advantages of this invention are described in, or are apparent from, the following detailed description of various exemplary embodiments of the devices and methods according to this invention.

BRIEF DESCRIPTION OF THE DRAWINGS

Various exemplary embodiments of this invention will be described in detail, with reference to the following figures, wherein;

FIG. 5A is a front perspective view of an alternate exemplary embodiment of a electronic continuity device according to this invention;

FIG. 5B is a back perspective view of the alternate exemplary embodiment of FIG. 5;

FIG. 5C is a rear exploded perspective view of the electronic continuity device of FIG. 5A;

FIG. 6 is a perspective view of another alternate exemplary embodiment of a electronic continuity device according to this invention;

FIG. 7 is a perspective view of still another alternate exemplary embodiment of a electronic continuity device according to this invention; and, FIG. 8 is a perspective view of yet another alternate exemplary embodiment of a electronic continuity device according to this invention.

DETAILED DESCRIPTION OF THE PREFERRED EMBODIMENTS

The present invention is an electronic signal continuity device 10, wherein the device 10 in particular is an electronic signal splitter. It should be appreciated that in other various exemplary embodiments the device could include other electronic continuity devices such as, but not limited to, directional couplers, multi-switches, and amplifiers for example.

The present invention incorporates a signal splitter/combiner with a single input connector and multiple "n" output connectors. The present invention utilizes current electronic signal splitting technology, such as but not limited to the basic "Wilkinson" technique on a printed circuit board or PCB. When the present invention is used as signal combiner, the multiple "n" output connectors become multiple "n" input connectors and the single input connector becomes the single output connector. Throughout this detailed description, only the aspects of the splitter will be discussed, with the understanding that when the device is used as a combiner, the detailed description applies, but in the reverse direction.

The device 10 made in accordance with the present invention can be used to split the signal from a variety of sources. The detailed discussion pertains primarily to radio frequency (RF) signals; the splitter 10 made in accordance with the present invention can split any signal that is transmitted via a wire.

Figure 1:
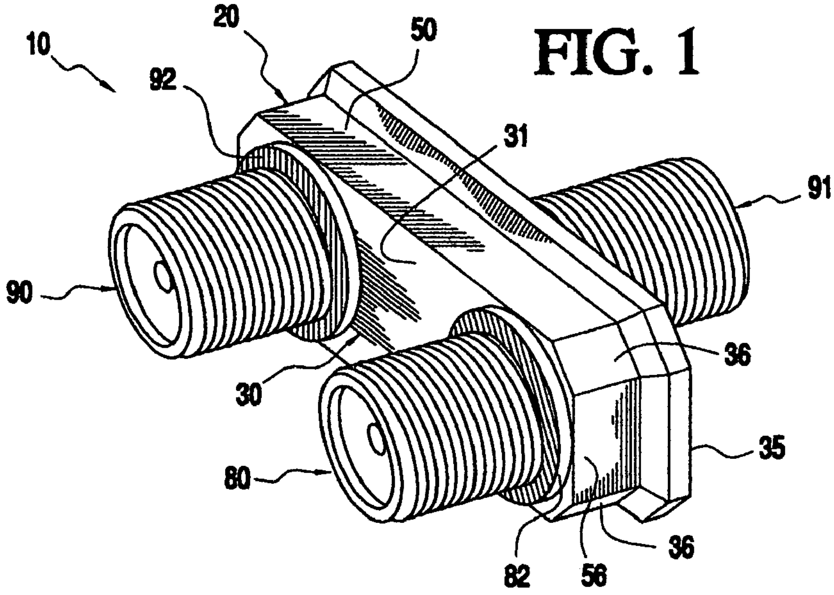
FIG. 1 is a front perspective view of a electronic continuity device made according to this invention.

FIG. 1 is a perspective view of the device 10, which is an exemplary embodiment of a signal splitter and combiner made in accordance with this invention. The device 10 is specifically designed to be used with coaxial cables with a F-Type connector. It should be appreciated that in other various exemplary embodiments the input connectors could be of any design common in the art of cable connectors, such as but not limited to N-Type connectors, AB connectors, phone jacks or other types of wire connectors common in the art. Additionally, the device 10, as shown in the exemplary embodiments (FIGS. 1 though 4) is not to be limited by the number of outlet ports shown. It should be appreciated that in other various exemplary embodiments, the device could have a multiple "n" of outlet ports as desired by a user.

Figure 2:
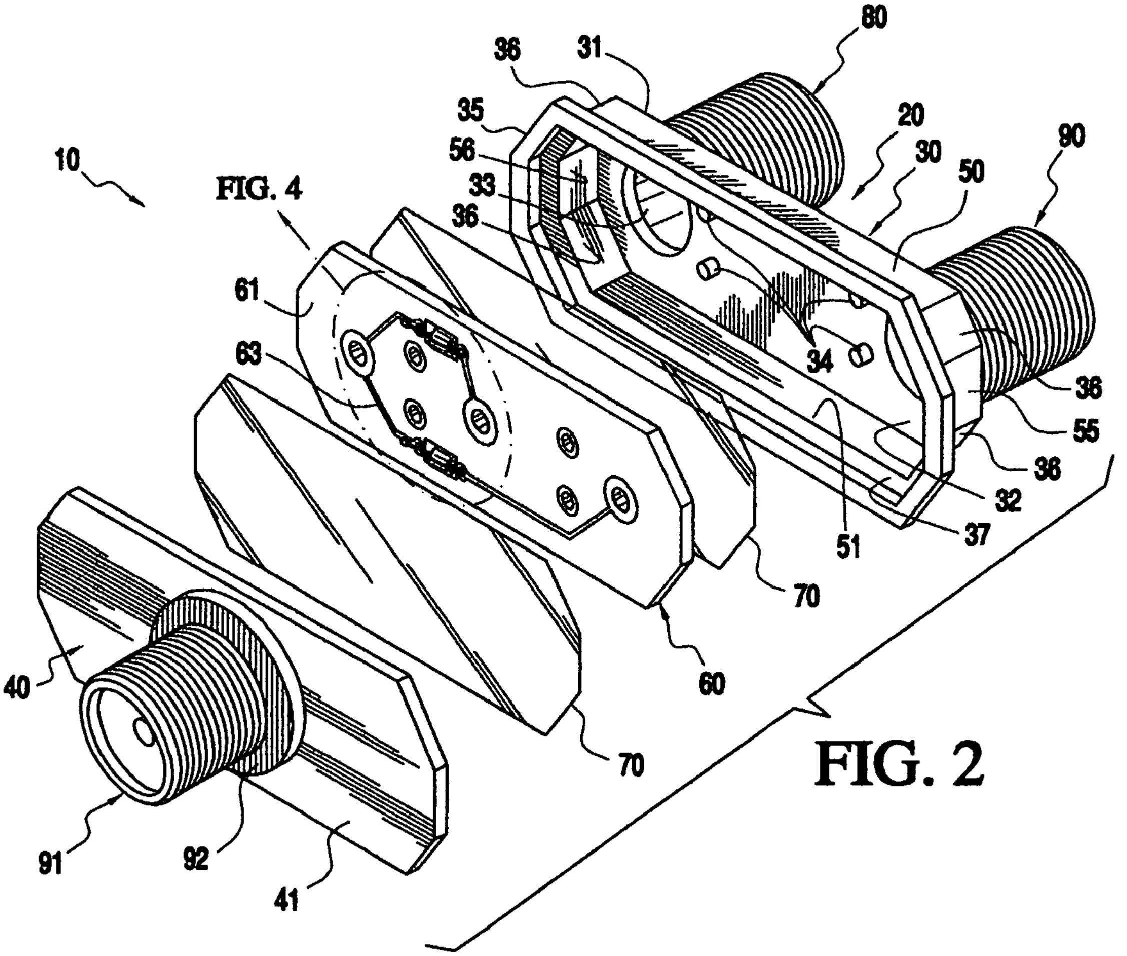
FIG. 2 is a rear exploded perspective view of the assembly of the electronic continuity device of FIG. 1.

The device 10, as shown in FIG. 2, includes a case or housing 20, an input port 80, two output ports 90 and 91, a printed circuit board (PCB) 60, and two insulation sheets 70. In this exemplary embodiment, the type of connecting devices used for the input port 80 and output ports 90 and 91 are identical, however, it should be appreciated that other exemplary embodiments the output ports could be any combination of cable connectors, such as but not limited to N-Type connectors, AB connectors, phone jacks or other types of wire connectors common in the art.

Figure 3:
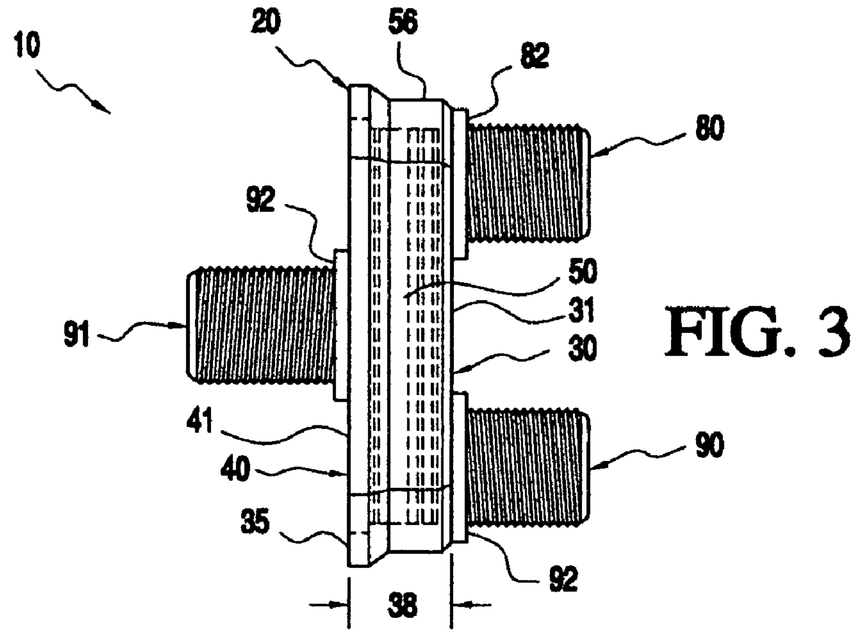
FIG. 3 is a side view of the electronic continuity device of FIG. 1.

The case 20 of the device 10, as shown in FIGS. 1 through 3 is an electronically conductive housing and comprises a first major portion 30, a second major portion 40 (FIG. 2), two side portions 50 and 51, two end portions 55 and 56 and a height 38 forming a volume for the case. The case 20 is constructed out of aluminum. It should be appreciated that in other various exemplary embodiments, the case could be fabricated out of materials that are common in the art of electronic device casings.

The first major portion 30 has a first surface or outside surface 31, a second surface or inside surface 32 and two orifices 33. The first major portion 30 also includes a perimeter 35. Disposed perpendicularly and generally equally spaced on the outside surface 31 of the first major portion 30 are one input port 80 and one output port 90 such that the input port 80 and output port 90 are disposed over the orifices 33. It should be appreciated that in other various exemplary embodiments, the first major portion could have any multiple number "n" of output ports and corresponding orifices. In this exemplary embodiment, the input port 80 and output port 90 are one inch apart from center to center. It should be appreciated that in other various exemplary embodiments, the input and output ports could be of a different separation distance. Additionally, on the inside surface 32 of the first major portion 30 are disposed four PCB support posts 34. It should further be appreciated that in other various exemplary embodiments, any number of PCB support posts may be used.

The input port or input connector 80 as shown in FIG. 1 is a threaded design or F-Type connector. It should be appreciated that in other various exemplary embodiments the input ports could be of any design common in the art of cable connectors, such as but not limited to N-Type connectors, AB connectors, phone jacks or other types of wire connectors common in the art. The input port 80 is fixed to the outside surface 31 of the first major portion 30. It should be appreciated that in other various exemplary embodiments, the input port could be removably attached to the outside surface. The input port 80 includes a first color coded indicator ring 82 attached to the input port such that the first color coded indicator ring 82 encircles the input port 80 and is disposed flat against the outside surface 31. In this exemplary embodiment the first color coded indicator ring 82 is green to signify to an observer that the input port 80 is an input port. It should be appreciated that in other various exemplary embodiments any color could be used although a standardization of the indicators ring is preferred.

Additionally, the first major portion 30 includes at least one of the output ports 90 as shown in FIG. 1. The output port 90 is a threaded design or F-Type connector. It should be appreciated that in other various exemplary embodiments the input connectors could be of any design common in the art of cable connectors, such as but not limited to N-Type connectors, AB connectors, phone jacks or other types of wire connectors common in the art. The output port 90 is fixedly attached to the outside surface 31 of the first major portion 30. It should be appreciated that in other various exemplary embodiments, the output port could be removably attached to the outside surface. The output port 90 includes a second color coded indicator ring 92 attached to the output port such that the second color coded indicator ring 92 encircles the output port 90 and is disposed flat against the outside surface 31. In this exemplary embodiment the second color coded indicator ring 92 is red to signify to an observer that the output port 90 is an output port. It should be appreciated that in other various exemplary embodiments any color could be used although a standardization of the color indicators is preferred.

The two side portions 50 and 51 along with the two end portions 55 and 56, are fixedly attached perpendicular to the first major portion 30 such that the four portions form the case 20 as shown in FIG. 2. Thus, the two side portions 50 and 51 along with the two end portions 55 and 56 form the perimeter 35 of the case 20. In this exemplary embodiment, the two side portions 50 and 51 are joined to the two end portions 55 and 56, by four angled portions 36. It is preferred that angled portions 36 be at about 45 degree angles to the side portions 50 and 51. It should be appreciated that the four angled portions 36 are design features and in other various exemplary embodiments, the two side portions could be joined at right angles to the two end portions.

The second major portion 40 has a first surface or outside surface 41, one output port 91, and one orifice (the orifice is not shown because the orifice is covered by the output port 91). Disposed perpendicularly and approximately in the center of the outside surface 41 of the second major portion 40 is the output port or connector 91 such that the output port 91 is disposed over the orifice. The location of an output port 91 on the second major portion 40 is a feature that differentiates the device 10 from conventional splitters. Conventional splitters have all the output ports disposed on the same surface or on a surface perpendicular to the surface with the input port. The present device has output ports 90 and 91 disposed on opposing surfaces 31 and 41.

The output port 91 is a threaded design or F-Type connector. It should be appreciated that in other various exemplary embodiments the output ports could be of any design common in the art of cable connectors, such as but not limited to N-Type connectors, AB connectors, phone jacks or other types of wire connectors common in the art. The output port 91 is fixed to the outside surface 41 of the second major portion 40. It should be appreciated that in other various exemplary embodiments, the output port could be removably attached to the outside surface. The output port 91 includes the second color coded indicator ring 92 attached to the output port such that the color coded ring 92 is encircles the output port 90 and is disposed flat against the outside surface 41. In this exemplary embodiment the second color coded indicator ring 92 is red to signify to an observer that the output port 91 is an output port. It should be appreciated that in other various exemplary embodiments any color could be used although a standardization of the color indicators is preferred.

The device 10 as shown in FIG. 1 through 3 is a two output port electronic signal splitting and combining device made in accordance with this invention. In other various exemplary embodiments, such as but not limited to the exemplary embodiments shown in FIG. 5A and FIG. 7, the device could have three or more output ports. If the device 10 has more than two output ports, the color for the second color coded indicator ring for the output ports will change and will be discussed in further detail below.

As shown in FIG. 2, the perimeter 35 of the casing 20 has an engaging rim 37, which is operably configured to receive and support the second major portion 40.

The second major portion 40 serves as the lid to the case 20. The second major portion 40 is attached to the case 20 by solder, however, it should be appreciated that in other various exemplary embodiments, the lid 40 could be attached by other methods common in the art, such as but not limited to press fit, crimping or gluing. Additionally, the second major portion 40 is fabricated out of the same material as the case 20.

The insulation sheets 70, shown in FIG. 2 are a mylar material and serve to prevent any portion of the PCB or its components from contacting the case 20. It should be appreciated that in other various exemplary embodiments, the insulation sheets could be constructed of other thin non-conducting insulating material common in the art of electronic circuitry.

It is desired that the height 38 between the first major portion 30 and the second major portion 40 be sized to maximize impedance. The height 38 of the case 20 is generally preferred to be about one quarter inch. More particularly, the height 38 is preferred to be five sixteenths of an inch. In the present embodiment the device 10 has approximate a 75 ohm impedance cavity for the circuit board and its components. It is also desired that the height 38 be a constant across the case 20. However, it should be appreciated that in other various exemplary embodiments, the height could vary depending on the components installed and the impedance cavity desired.

Figure 4:
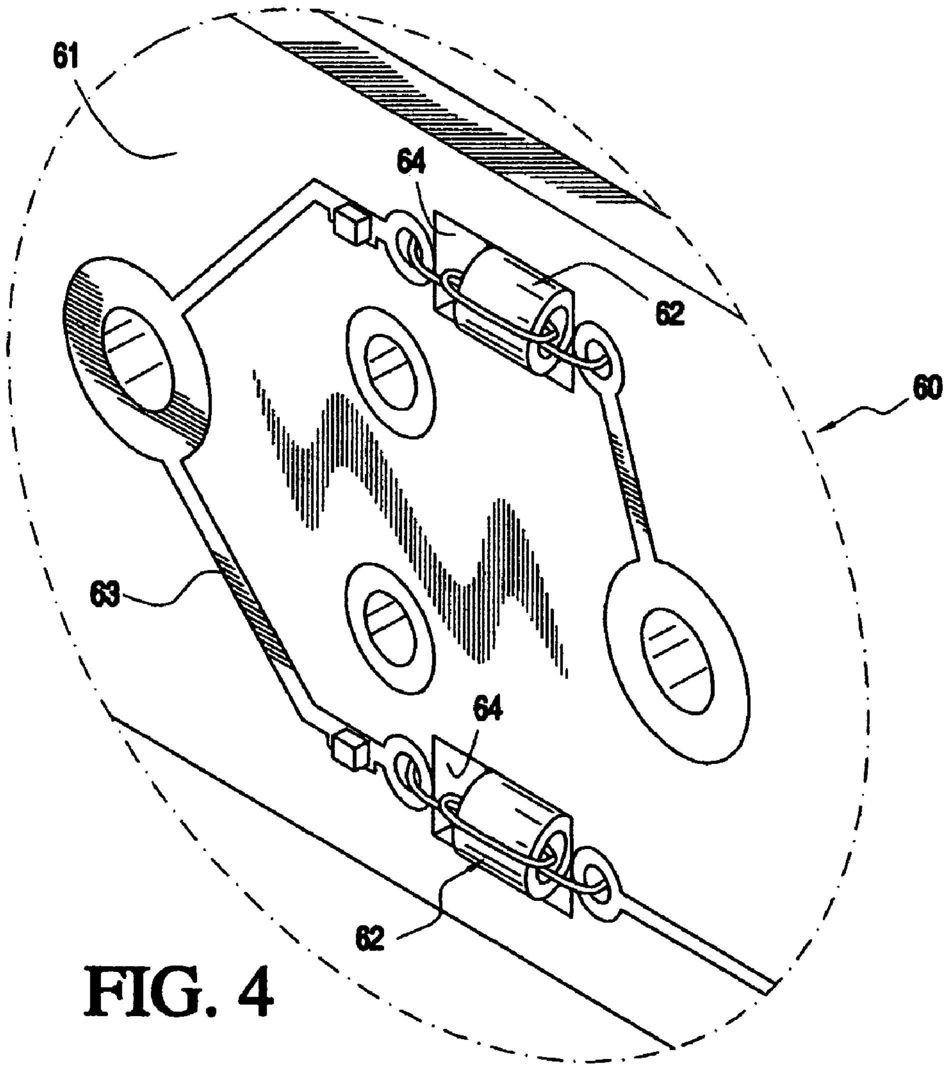
FIG. 4 is a detailed perspective view of a printed circuit board of the electronic continuity device of FIG. 1.

Now referring to FIG. 4, the printed circuit board or PCB 60 incorporates state of the art splitter technology, which includes a main board 61, wherein the main board 61 is operably configured with current integrated splitter technology, as represented by 63 in FIG. 4, and transformers or splitter cores 62 along with other components (including capacitors and resistors) not shown. It should be appreciated that in other various exemplary embodiments the PCB could include specific electrical components to allow Direct Current (DC) power to pass between the input port and one or more of the output ports.

The PCB 60 also includes component voids or orifices 64. Is should be appreciated that in other various exemplary embodiments the voids are merely recesses that do not extend all the way through the thickness of the PCB. The splitter cores 62 are located in the component voids 64. It should be appreciated that in other various exemplary embodiments, the component voids within the PCB could also include other components such as but not limited to capacitors, shunts, surge protectors, etc. The splitter 10 utilizes current "surface mounted" technology for additional saving of space on all the other components on the PCB 60 as is common in the art.

The transformers 62 in this exemplary embodiment are of a bi-filar and torodial design. However, it should be appreciated that in other various exemplary embodiments, other designs of transformers that are common in the art of electronic signal splitting devices may be used, such as but not limited to bi-trifilar, tri-filar, binocular cores, etc.

Further, it should be appreciated that the PCB 60 is constructed using any printed circuit board technology common in the art of making splitter PCBs. The present invention improves upon conventional splitter PCBs by the inclusion of the component voids 64.

The PCB 60 also includes (not shown) an internal ground screw to ground the PCB 60 to the case 20. In conventional splitter devices the ground screw is mounted parallel to the axis of the input and output ports. The device 10 uses a ground screw with a low-profile thickness, which is mounted perpendicular to the axis of the input and output ports 80, 90 and 91.

Another feature of the device 10 that is different from conventional splitters is the method in which the PCB 60 is attached to the case 20. The case 20 of the splitter 10 uses the PCB support posts 34 that support the PCB 60 and allow the PCB 60 to be soldered to the PCB support posts 34. This method replaces the conventional method of using screws to secure a printed circuit board to the splitter casing, which requires more space.

The insertion of the transformers 62 into of the component voids 64 within the PCB 60 along with the above mentioned features are what allow the case 20 to be of a smaller size. The case 20 of the device 10 has the height 38 of one-quarter inch rather than the three eights to one half inch size of conventional splitter casings. Thus, the smaller casing size in combination with the feature of an output port 91 on the second major portion 40 is unique to the present invention and allows the device 10 to be used in applications where conventional splitters cannot be used, such as, for example, but not limited to the area of just one-half of a standard single electrical gang box as found in a wall in a house. This permits the device 10 to be inserted into the electrical gang box along with a phone jack or a modem jack.

Additionally, with the use of the device 10 in an electrical gang box, the device 10 is now more accessible than in an attic or crawl space and less coaxial cable is required to extend the cable to a neighboring room, thus reducing costs. Further, if using an alternative exemplary embodiment of the device 10, which has 2 or more output ports 90 disposed on the first major portion 30, the device 10 could act as a conveniently located mini central wiring point or "hub" to aid in the wiring of centrally located rooms.

All splitters have an insertion loss, meaning the signal out is less than the signal in and an isolation loss, which is a signal loss between output ports. An additional advantage of the device 10 gained by the reduction in case 20 size over conventional splitters is a 15 percent decrease in insertion loss. This is accomplished primarily by the reduction of the case 20 size to affect a 75 ohm impedance cavity. The inclusion of surface mount technology also adds reduced insertion losses.

The height 38 is important to allow the device 10 to perform its function across a wide bandwidth, with a minimum of difference in the splitter loss from the low end to the high end of its operational bandwidth. The height 38 in the present embodiment mirrors the impedance of a coaxial cable (not shown) reducing insertion and return loss across the device 10. By mirroring the impedance of the coaxial cable, insertion loss and return loss both have a fifteen percent improvement over conventional devices. This improvement in the present invention device 10 provides a distinct advantage over conventional devices in particular for Voice Over Internet Protocol (VOIP) applications or other systems that utilize a reverse path continuity.

Further, it should also be appreciated that in other various exemplary embodiments, the PCB could be encapsulated in a sub metal case similar to the case 20 of device 10 and the sub metal case could have a cosmetic or custom nonmetallic outer case.

FIGS. 5A, 5B and 5C illustrate a device 510, which is an alternative exemplary embodiment of the splitter 10 made in accordance with the present invention. The device 510 is similar to the device 10 in that it has a case 520, an input port 580, a plurality of output ports 590 and 591, a printed circuit board (PCB) 560, and two insulation sheets 570 and a plurality of transformers 562.

The device 510, like device 10, includes a first major portion 530 and a second major portion 540. The device 510 differs from the device 10 in that it includes an input port 580 and two output ports 590 disposed on the first major portion 530. The input port 580 and two output ports 590 are generally preferred to be equally spaced on the first major portion. In this exemplary embodiment the input port 580 and the two output ports 590 are spaced approximately one inch from the center of the ports. It should be appreciated that in other various exemplary embodiments the spacing could be different. It should further be appreciated that in other various exemplary embodiments the first major portion could include any multiple number "n" of output ports.

Further, the device 510 includes an output port 591 disposed on the center of the second major portion 540 as shown in FIG. 5B. The output port 591 is identical to the output ports 590 and the input port 580. It should be appreciated that in other various exemplary embodiments the input port and the output ports could be any combination of connectors common in the art of coaxial cable connectors. It should further be appreciated that in other various exemplary embodiments, the device 510 could be constructed without the output port 591 thereby making the device 510 a two output port splitter rather than a three output port splitter, commonly referred to as a vertical splitter.

The device 510 further includes color coded indicator rings similar to device 10 in that the input port 580 has a green color coded ring 582. The output ports 590 and 591 have color coded indicator rings 592 that are yellow representing a splitter device with three output ports. It should be appreciated that in other various exemplary embodiments any color could be used although a standardization of the color indicators is preferred.

Additionally, the PCB 560, similar to device 10 includes transformers or splitter cores 562 and component voids 564, as shown in FIG. 5C. The PCB 560 includes three splitter cores 562 and three component voids 564. It should be appreciated that in other various exemplary embodiments, the number of splitter cores and component voids will equal the number of output ports in the device.

The device 510 further includes three side portions 550, 551 and 552 and three end portions 555, 556, and 557, as shown in FIGS. 5A, 5B and 5C. The device 510 has a generally triangular shape, wherein the three side portions 550, 551 and 552 are of equal length. An advantage of the triangular shape over conventional splitters is that the device 510 can be used in applications where space does not allow a square or rectangular shaped splitter.

FIG. 6 illustrates a device 610, which is another alternative exemplary embodiment of the splitter 10 made in accordance with this invention. The device 610 is similar to the device 10 in that it has a case 620, an input port 680, two output ports 690 and 691, a printed circuit board (not shown) and a plurality of transformers (not shown). Also, as in device 10, the device 610 has perimeter 635 with an engaging rim (not shown).

The device 610 like, device 10, further includes a first major portion 630 with an outside surface 631, a second major portion (not shown), two side portions 650 and 651, and two end portions 655 and 656. The device 610 differs from the device 10 in that the input port 680 and one output port 690 are disposed at the junction of the side portion 650 and the first major portion 630 at an angle 659. In the present exemplary embodiment, the angle 659 is preferred to be about 45 degrees from the perpendicular to the outside surface 631. It should be appreciated that in other exemplary embodiments, the angle could be of other values such as but not limited to 30 or 60 degrees.

Additionally, the input port 680 is disposed such that it is adjacent to one end portion 655 and the one output port is disposed such that it is adjacent to the opposing end portion 656. In this exemplary embodiment the input port 680 and the output port 690 are one inch apart at the center. It should be appreciated that in other various exemplary embodiments the input port and output port could be of a different distance.

Another difference between the device 610 and the device 10 is that the second output port 691 is disposed on the first major portion 630 rather than the second major portion. Further, the second output port 691 is disposed at the midpoint on the junction of the side portion 651 and the first major portion 630 at an angle 659 from the perpendicular to the outside surface 631. It should be appreciated that in other various exemplary embodiments the first major portion could include any multiple number "n" of output ports. Further, it should be appreciated that in other various exemplary embodiments, the input and output ports could be removably attached to the device.

The device 610 further includes color coded indicator rings similar to device 10 in that the input port 680 has a green color coded indicator rings 682 and the output ports 690 have color coded indicator rings 692 that are red representing a splitter device with two output ports.

The device 610 further includes mounting tabs 672 and 673 and a grounding connection 674. The function of the mounting tabs 672 and 673 are to provide for a user a means for securing the device 610 to another object with a fastener, if required. The mounting tab 672 is disposed on the side portion 650 and flush with the perimeter 635 such that the mounting tab 672 is positioned between the input port 680 and the output port 690 as shown in FIG. 6. The mounting tab 673 is disposed on the side portion 651 such that the mounting tab 673 is flush with the perimeter 635 and adjacent to the end portion 656. Additionally, the mounting tab 672 is operably configured with an oval orifice 676 and mounting tab 673 is operably configured with a circular orifice 677. Orifices 676 and 677 are operably configured to receive a fastener for mounting the device 610.

The grounding connection 674 on the device 610 includes a grounding screw 678 and a grounding wire orifice 679. The grounding connection 674 is disposed on the side portion 651 and flush with the perimeter 635. In this exemplary embodiment, the grounding connection 674 is disposed generally adjacent to the junction of the side portions 651 and the end portions 655. In other various exemplary embodiments the grounding connection location could be anywhere along the perimeter and flush with the perimeter as long as no interference with the input and output connectors occurs.

FIG. 7 illustrates a device 710, which is still another alternative exemplary embodiment of the splitter 10 made in accordance with this invention. The device 710 is similar to the devices 10 and 610. The device 710 is similar to the device 610 in that it has a case 720, an input port 780, a plurality of output ports 790 and 791, a printed circuit board (not shown) and a plurality of transformers (not shown). Also, as with device 10, the device 710 has perimeter 735 with an engaging rim (not shown).

The device 710 further includes a first major portion 730 with an outside surface 731, a second major portion (not shown) two side portions 750 and 751 and two end portions 755 and 756.

Additionally, the device 710 like the device 610 has the input port 780 and output port 790 disposed at the junction of the side portion 750 and the first major portion 730 at an angle 759, which is preferred to be about 45 degrees from the perpendicular to the outside surface 731. Additionally, the input port 780 is disposed such that it is adjacent to one end portions 755 and one output port is disposed such that it is adjacent to the opposing end portion 756. However, the device 710 also includes an additional output port 790. Output port 790 is disposed between the input port 780 and the first output port 790 and at the junction of the side portion 750 and the first major portion 730 at an angle 759, which is preferred to be about 45 degrees from the perpendicular to the outside surface 731. In this exemplary embodiment the input port 780 and the two output ports 790 are spaced equal distant from each other at approximately one inch. It should be appreciated that in other various exemplary embodiments the spacing could be different.

Continuing, the device 710, like device 610, includes output ports 791 disposed on the first major portion 730 rather than the second major portion. However, the device 710, unlike device 610 has a total of five output ports rather than two. The third, fourth and fifth output ports 791 are disposed on the junction of the side portion 751 opposite and the first major portion 730 at an angle 759, which is preferred to be about 45 degrees from the perpendicular to the outside surface 731. The output ports 791 are generally spaced equal distant from each other at approximately one inch. It should be appreciated that in other various exemplary embodiments the spacing could be different. It should be appreciated that in other various exemplary embodiments, the first major portion could include any multiple number "n" of output ports. Further, it should be appreciated that in other various exemplary embodiments, the input and output ports could be removably attached to the device.

The device 710 further includes color coded indicator rings similar to device 10 in that the input port 780 has a green color coded indicator rings 782. The output ports 790 and 791 have color coded indicator rings 792 that are brown representing a splitter device with five output ports.

The device 710 further includes mounting tabs 772 and 773 and a grounding connection 774. The mounting tab 772 is disposed on the side portion 750 and flush with the perimeter 735 such that the mounting tab 772 is positioned between the input port 780 and the center output port 790, as shown in FIG. 7. The mounting tab 773 is disposed on the side portion 751 such that the mounting tab 773 is flush with the perimeter 735 and between the center output port 791 and the output port 791 adjacent to the end portion 756. Additionally, the mounting tab 772 is operably configured with an oval orifice 776 and mounting tab 773 is operably configured with a circular orifice 777. Orifices 776 and 777 are operably configured to receive a fastener for mounting the device 710.

The grounding connection 774 on the device 710 includes a grounding screw 778 and a grounding wire orifice 779. The grounding connection 774 is disposed on the side portion 751 and flush with the perimeter 735. In this exemplary embodiment, the grounding connection 774 is disposed on the first major portion 730 as shown in FIG. 7.

It should be appreciated that in other various exemplary embodiments the device 710 could be comprised all input ports on one side and all output ports on the opposing side acting as signal pass-through device.

For any coaxial cable, there is a minimum bending radius, determined by the diameter of the cable, and the materials from which it is made. If a coax cable is bent beyond this minimum, the internal dimensions will distort, and the cable will no longer function correctly (exhibiting excessive broadband loss and also frequency-specific loss). Avoiding bending a coaxial cable beyond its minimum bending radius is critical. The devices 610 and 710 permit a coax cable to be routed and split in tight corners without any distortion or signal loss.

FIG. 8 illustrates a device 810, which is still another alternative exemplary embodiment of a splitter 10 made in accordance with this invention. The device 810 is similar to the devices 10 and 610. The device 810 is similar to the device 610 in that it has a case 820, an input port 880, two output ports 890 and 891, a printed circuit board (not shown) and a plurality of transformers (not shown). Also, as in device 10, the device 810 has perimeter 835 with an engaging rim (not shown).

The device 810 like, device 610, includes a first major portion 830 with an outside surface 831, a second major portion (not shown), two side portions 850 and 851 and two end portions 855 and 856. Additionally, the device 810, like the device 610 the input port is disposed at the junction of the side portion 850 and the first major portion 830 at an angle 859, which is preferred to be about 45 degrees from the perpendicular to the outside surface 831. However, the device 810 differs from the device 610 in that no output port is disposed on the same side as the input port 880. The device 810, like the device 610 includes one output port 891 disposed on the side portion 851 and on the junction of the side portion 851 and the first major portion 830 at an angle 859, which is preferred to be about 45 degrees from the perpendicular to the outside surface 831.

The device 810 is unique in that while it does include two output ports, the location of the output port 890 is disposed at the junction of the side portion 855 and the first major portion 830 rather than the same side as the input port 880 and at an angle 859, which is preferred to be about 45 degrees from the perpendicular to the outside surface 831. Further, it should be appreciated that in other various exemplary embodiments, the input and output ports could be removably attached to the device.

The device 810 further includes color coded indicator rings similar to device 10 in that the input port 880 has a green color coded indicator rings 882 and the output ports 890 and 891 have color coded indicator rings 892 that are red representing a splitter device with two output ports.

The device 810 has a mounting tab 873, which is disposed in the case 820 vice on the side 850. The mounting tab 873 includes a circular orifice 877. The Orifice 877 is operably configured to receive a fastener for mounting the device 810.

Further, the device 810 includes a grounding connection 874. The grounding connection 874 includes a grounding screw 878 and a grounding wire orifice 879. The grounding connection 874 is disposed on the first major surface 830.

All of the devices discussed above display a pattern of color coded indicator ring or identification scheme, as indicated by lined shading in the Figures, which is incorporated into the present invention. The color scheme aids the user or technician in the ability to quickly identify which port is the input port and which ports are the output ports. Additionally, the color scheme aids the installer in identifying what type of splitter is being installed, for example a four port splitter rather than a 5 port splitter. Further, the identification scheme also allows a port with the coaxial cable installed to be seen by the technician without removing the coaxial cable. An exemplary embodiment of the color coding scheme according to this invention is as follows:

| PORT | INDICATOR | THIS EMBODIMENT |
|---|---|---|
| *Input | Color 1 | Green |
| *Two-way splitter | Color 2 | Red |
| *Three-way splitter | Color 3 | Yellow |
| *Four-way splitter | Color 4 | Blue |
| *Five-way splitter | Color 5 | Brown |
| *Six-way splitter | Color 6 | Orange |
| *Seven-way splitter | Color 7 | Black |
| *Eight-way splitter | Color 8 | Purple |

The present invention further includes an indicator coding method for electronic signal continuity devices, comprising the steps of first obtaining a first electronic signal continuity device having one input port and at least two output ports; second obtaining a second electronic signal continuity devices having one input port and at least one more output port than the first electronic signal continuity device; third obtaining a plurality of first coded indicator rings having a first color; fourth obtaining a plurality of second coded indicator rings having a second color; and, fifth obtaining a plurality of third coded indicator rings having a third color. The method step continue with affixing the first coded indicator rings to the input ports of both the first and second electronic signal continuity devices; affixing the second coded indicator rings to the output ports on the first electronic signal continuity device; and, affixing the third coded indicator rings to the output ports on the second electronic signal continuity device.

It is preferred that each of the colors above are different form the other. Is should be appreciated that in other various exemplary embodiments other colors could be used for the scheme and a splitter is not limited to the range of two to eight-way splitters.

The device is color coded by the addition of the appropriate color ring installed around the respective port. Further the words, "Input" and "Output" are printed on the color coded ring for the respective port. Also, it should be appreciated that in other various exemplary embodiments, valuable information, such as but not limited to, the frequency range of the splitter or the insertion loss could printed on the color rings to provide this information visibly and quickly to installer and users. Additionally, the color coded indicator rings will aid installers and users in identifying different splitters types instantly such as resisters are color coded for easy identification.

While the invention described above includes a variety of combinations of the electronic signal splitter device 10, it should be appreciated that in other various exemplary embodiments, the splitter 10 could have an any number of output ports.

The frequency range of the exemplary embodiments described above is generally about 50 to 2,500 MHz. However, it should be appreciated that in other various exemplary embodiments, the components on the PCB could be changed to effect a change in the frequency range for example, but not limited to, a frequency range of 50 to 3000 Mhz.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of this invention.

What is claimed is:

1. An electronic signal continuity device comprising:

an electrically conductive case having a volume, an input port and at least two output ports, wherein the input and output ports each include a path of electrical connectivity; and a printed circuit board (PCB) in electrical communication with the input port and the output ports through each of said path of electrical connectivity and operably configured to transmit an electronic signal received at the input port to the output ports; and, wherein the PCB is disposed within the volume of the electrically conductive case, and the PCB further includes an orifice and a plurality of electronic components, wherein at least one of the plurality of electronic components is disposed in the orifice.

2. An electronic signal continuity device as recited in claim 1, wherein the electrically conductive case further includes a first major portion and a second major portion opposing the first major portion, and one of the at least two output ports and the input port are disposed on the first major portion, and one of the at least two output ports is disposed on the second major portion.

3. An electronic signal continuity device as recited in claim 1, wherein the PCB is operably configured to split the electronic signal received at the input port to the at least two output ports.

4. An electronic signal continuity device as recited in claim 1, wherein at least one of the plurality of electronic components is a transformer.

5. An electronic signal continuity device as recited in claim 1, wherein the input port includes a first coded indicator ring and the first coded indicator ring is a first color, and the at least two output ports include a second coded indicator ring and in the second indicator ring is a second color.

6. An electronic signal continuity device as recited in claim 1, wherein at least one of the plurality of electronic components is a splitter core.

7. An electronic signal continuity device as recited in claim 1, wherein at least one of said output ports and said input port is removably attached to the electrically conductive case.

8. A signal continuity device comprising;

an electrically conductive housing having a first major surface, an opposing second major surface and a volume;

a printed circuit board (PCB) being disposed in the volume and operably configured to transmit an incoming electronic signal;

an input port disposed on the first major surface and being in electrical communication with the PCB;

a first output port disposed on the first major surface and being in electrical communication with the PCB; and, a second output port disposed on the opposing second major surface and being in electrical communication with the PCB.

9. A signal continuity device as recited in claim 8, wherein the first major surface further includes a third output port.

10. A signal continuity device as recited in claim 8, wherein the electrically conductive housing is operably configured to fit inside one half of a standard electrical wall box, such that the second output port is operably configured to be extended through an electrical wall box cover plate.

11. A signal continuity device as recited in claim 8, wherein the PCB is operably configured to split the electronic signal to the first and second output ports.

12. A signal continuity device as recited in claim 8, wherein at least one of said output ports and said input port are removably attached to the electrically conductive case.

13. A signal continuity device as recited in claim 8, wherein the input port includes a first coded indicator ring and the first coded indicator ring is a first color, and the two output ports include a second coded indicator ring and in the second indicator ring is a second color.

14. A frequency continuity case being electrically conductive comprising:

a first major surface;

a second major surface opposing the first major surface;

a first end surface connecting the first and second major surfaces, wherein a first connection is formed by the first major surface and the first end surface;

a second end surface opposing the first end surface and connecting the first and second major surfaces, wherein a second connection is formed by the first major surface and the second end surface;

an angle alpha, wherein the angle alpha is from the first major surface in a direction away from the second major surface;

an electrical input connector disposed on the first major surface at the angle alpha and adjacent to the first connection;

at least two electrical output connectors disposed on the first major surface, wherein one of the at least two electrical output connectors is disposed on the first major surface at the angle alpha, adjacent to the second, and being oriented generally perpendicular to the electrical input connector; and, the other of the at least two electrical output connectors is disposed on the first major surface at the angle alpha, adjacent to the first.

15. A frequency continuity case as recited in claim 14, wherein the angle alpha is about 45 degrees.

16. A frequency continuity case as recited in claim 14, wherein the electrical input connector has a first indicator ring disposed at a base of the electrical input connector and the first indicator ring is a first color, and the at least two electrical output connectors have a second indicator ring at a base of each of the at least two output ports and in the second indicator ring is a second color.

17. A frequency continuity case as recited in claim 14, wherein at least one of the electrical output connectors and the electrical input connector are removably attached to the case.

18. An frequency continuity case as recited in claim 14, wherein the at least two electrical output connectors are disposed on the first major surface at the angle alpha, adjacent to the second connection, and the at least two electrical output connectors are oriented generally perpendicular to the electrical input connector, further wherein the at least two electrical output connectors are arrayed in a line along the second connection.

19. A frequency continuity case as recited in claim 14, wherein the at least two electrical output connectors are disposed on the first major surface at the angle alpha, adjacent to the first connection, oriented in the same direction as the electrical input connector and the at least two electrical output connectors are arrayed in a line along the first connection.

20. An electronic signal continuity printed circuit board (PCB) comprising:

a main board with integrated electronic continuity circuitry operably configured to transmit an incoming electronic signal into at least two outgoing electronic signals;

a component void recessed into the main board; and, a plurality of electronic components attached to the main board, wherein at least one of the component voids is formed on the main board and at least one of the plurality of electronic components is disposed in the void.

21. An electronic signal continuity printed circuit board (PCB), as recited in claim 20, wherein the electronic continuity circuitry operably configured to split the incoming electronic signal into the at least two outgoing electronic signals.

22. An electronic signal continuity printed circuit board (PCB) as recited in claim 20, wherein at least one of the plurality of electronic components is a transformer.

23. An electronic signal splitter device comprising:

a electrically conductive case having a volume, an electrically conductive input port and at least two electrically conductive output ports, wherein the electrically conductive case includes a first major portion and a second major portion opposing the first major portion by a distance of about five sixteenths of an inch;

a printed circuit board (PGB) operably configured to split an electronic signal received at the electrically conductive input port to the at least two electrically conductive output ports, and the PCB being disposed in the volume of the electrically conductive case, and the PCB further including an orifice and a plurality of electronic components, wherein at least one of the plurality of electronic components is displaced in the orifice; and, wherein one of the at least two electrically conductive output ports and the input port are disposed on the first major portion, and the remaining at least two electrically conductive output ports are disposed on the second major portion.

24. An electronic signal splitter device as recited in claim 23, wherein at least one of the plurality of electronic components is a transformer.

25. An electronic signal splitter device as recited in claim 23, wherein the input port further includes a coded indicator ring disposed on the input port and the indicator ring is a first color; and wherein the at least two output ports have a coded indicator ring disposed on the at least two output ports and in the indicator ring is a second color.

26. An electronic signal splitter device as recited in claim 25, wherein the first color is green and the second color is red.

* * * * *